United States Patent
Vystavel et al.

(10) Patent No.: US 10,978,272 B2
(45) Date of Patent: Apr. 13, 2021

(54) MEASUREMENT AND ENDPOINTING OF SAMPLE THICKNESS

(71) Applicant: FEI Company, Hillsboro, OR (US)

(72) Inventors: Tomas Vystavel, Brno (CZ); Pavel Stejskal, Brno (CZ); Marek Uncovsky, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/579,006

(22) Filed: Sep. 23, 2019

(65) Prior Publication Data

US 2020/0135427 A1    Apr. 30, 2020

(30) Foreign Application Priority Data

Oct. 31, 2018  (EP) .................................. 18203717

(51) Int. Cl.
*H01J 37/28* (2006.01)
*G01B 11/06* (2006.01)

(52) U.S. Cl.
CPC .............. *H01J 37/28* (2013.01); *G01B 11/06* (2013.01); *H01J 2237/2802* (2013.01); *H01J 2237/30466* (2013.01); *H01J 2237/31749* (2013.01)

(58) Field of Classification Search
CPC ............... H01J 37/28; H01J 2237/2802; H01J 2237/30466; H01J 2237/31749; H01J 2237/24455; H01J 2237/24578; H01J 2237/31745; H01J 37/295; H01J 37/304; G01B 11/06; G01B 15/02; G01N 23/2055
USPC ........................................ 250/307, 305, 310
See application file for complete search history.

(56) References Cited

U.S. PATENT DOCUMENTS

| 4,168,911 | A  | * | 9/1979  | Pryor    | G01B 11/06 356/35 |
| 6,016,202 | A  | * | 1/2000  | Fuchs    | G01B 11/06 356/432 |
| 10,651,008 | B2 | * | 5/2020  | Buijsse  | H01J 37/222 |
| 2001/0019407 | A1 | * | 9/2001  | Sato     | G03F 7/70591 356/237.4 |
| 2002/0158193 | A1 | * | 10/2002 | Sezginer | G03F 7/70633 250/237 G |

(Continued)

FOREIGN PATENT DOCUMENTS

JP      2004 286639      10/2004

OTHER PUBLICATIONS

Pollock J A et al; Accuracy and precision of thickness determination from position-averaged convergent beam electron diffraction patterns using a single-parameter metric; Ultramicroscopy; Oct. 2017, pp. 86-96,vol. 181, Victoria, AU.

(Continued)

*Primary Examiner* — David A Vanore

(57) ABSTRACT

The invention relates to a method of determining the thickness of a sample. According to this method, a diffraction pattern image of a sample of a first material is obtained. Said diffraction pattern image comprises at least image values representative for the diffraction pattern obtained for said sample. A slope of said image values is then determined. The slope is compared to a relation between the thickness of said first material and the slope of image value of a corresponding diffraction pattern image of said first material. The determined slope and said relation are used to determine the thickness of said sample.

18 Claims, 5 Drawing Sheets

(56) References Cited

U.S. PATENT DOCUMENTS

| | | | |
|---|---|---|---|
| 2010/0158392 A1* | 6/2010 | Adams | B82Y 30/00 |
| | | | 382/218 |
| 2012/0187285 A1 | 7/2012 | Young et al. | |
| 2013/0175445 A1* | 7/2013 | Kim | H01J 37/08 |
| | | | 250/310 |
| 2013/0277552 A1 | 10/2013 | Nanri et al. | |
| 2014/0306108 A1* | 10/2014 | Billinge | H01J 37/261 |
| | | | 250/307 |
| 2015/0060664 A1* | 3/2015 | Man | G01N 23/20091 |
| | | | 250/307 |
| 2015/0115156 A1* | 4/2015 | Suzuki | H01J 37/3056 |
| | | | 250/307 |
| 2016/0196952 A1* | 7/2016 | Matsumoto | H01J 37/295 |
| | | | 250/305 |
| 2017/0047196 A1 | 2/2017 | Shidara | |
| 2020/0135427 A1* | 4/2020 | Vystavel | G01B 11/06 |

OTHER PUBLICATIONS

Lebeau J M et al; Position averaged convergent beam electron diffraction: Theory and applications; Ultramicroscopy; Jan. 1, 2010; pp. 118-125; vol. 110, No. 2; Elsevier, Amsterdam, NL.

Cassada W A et al; Electron diffraction studies of Al2CuLi [T1] plates in an A1-2.4Li-2.4Cu@?0.18Zr alloy; Scripta Metallurgica, Elsevier Science Ltd.; Mar. 1, 1987, pp. 387-392; vol. 21, No. 3, Kidlington, GB.

* cited by examiner

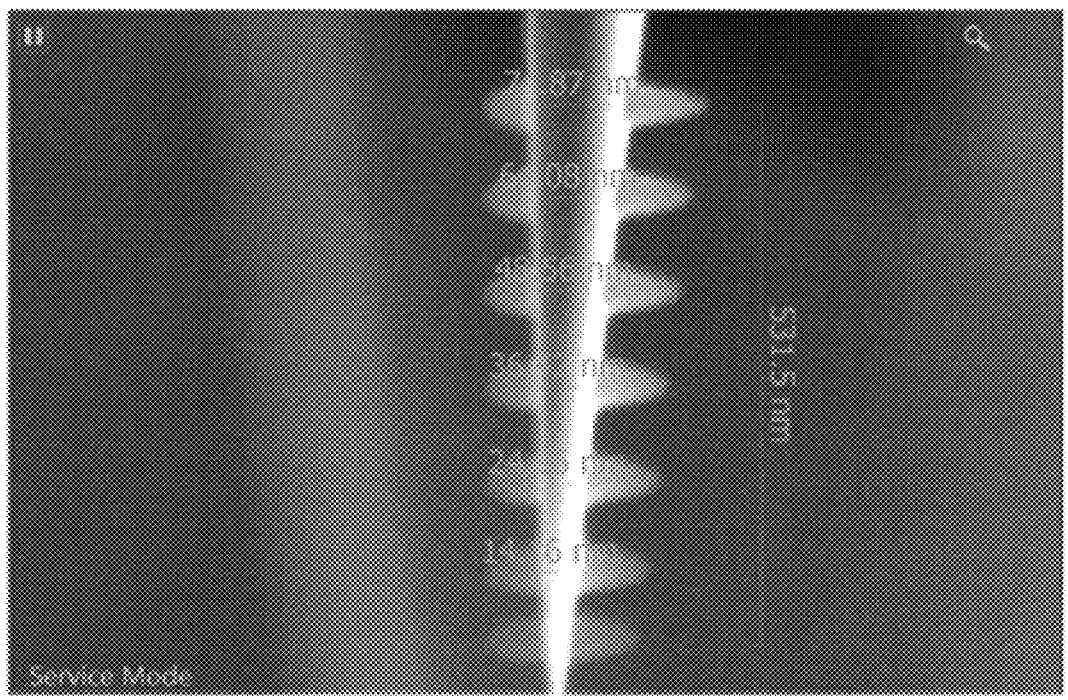
Fig. 3
106
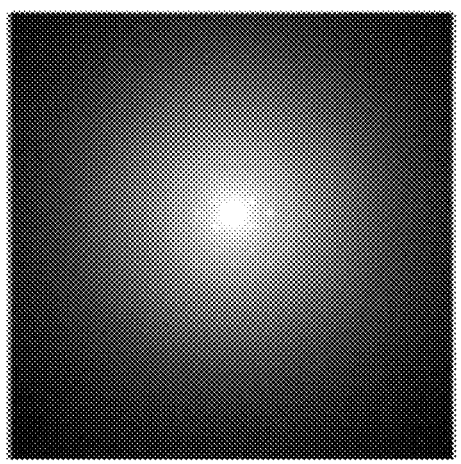
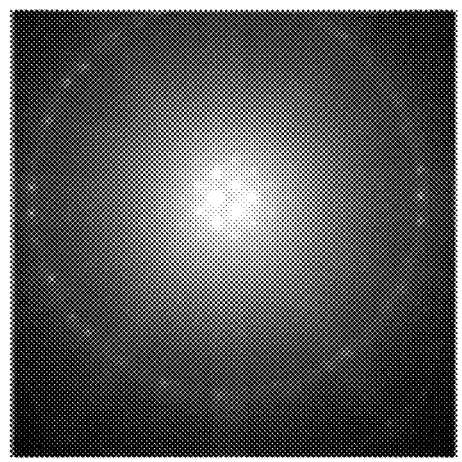
Fig. 4a          Fig. 4b

MEASUREMENT AND ENDPOINTING OF SAMPLE THICKNESS

FIELD OF THE INVENTION

The present invention relates to preparation of samples and methods of analysis for transmission electron microscopes and scanning transmission electron microscopes.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting lines, spacing and diameter of contact holes, and the surface geometry such as corners and edges of various features. Features on the wafer are three-dimensional structures and a complete characterization must describe not just a surface dimension, such as the top width of a line or trench, but a complete three-dimensional profile of the feature. Process engineers must be able to accurately measure the critical dimensions (CD) of such surface features to fine tune the fabrication process and assure a desired device geometry is obtained.

Typically, CD measurements are made using instruments such as a scanning electron microscope (SEM). In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding spot on the surface. As features continue to get smaller and smaller, however, there comes a point where the features to be measured are too small for the resolution provided by an ordinary SEM.

Transmission electron microscopes (TEMs) allow observers to see extremely small features, on the order of nanometers. In contrast to SEMs, which only image the surface of a material, TEMs also allow analysis of the internal structure of a sample. In a TEM, a broad beam impacts the sample and electrons that are transmitted through the sample are focused to form an image of the sample. The sample must be sufficiently thin to allow many of the electrons in the primary beam to travel though the sample and exit on the opposite side. Samples, also referred to as lamellae, are typically less than 100 nm thick.

In a scanning transmission electron microscope (STEM), a primary electron beam is focused to a fine spot, and the spot is scanned across the sample surface. Electrons that are transmitted through the work piece are collected by an electron detector on the far side of the sample, and the intensity of each point on the image corresponds to the number of electrons collected as the primary beam impacts a corresponding point on the surface. The term "TEM" as used herein refers to a TEM or a STEM and references to preparing a sample for a TEM are to be understood to also include preparing a sample for viewing on a STEM. The term "S/TEM" as used herein also refers to both TEM and STEM.

Bright field imaging and dark field imaging are often used in the context of S/TEM imaging. A bright field image may be formed by selecting electrons from a central diffraction spot to form the image. In other words, bright-field images are formed by detecting the electrons that pass through the sample without significantly scattering as they pass through the sample. In contrast, a dark field image may be formed in the S/TEM by using some or all of the non-central (diffracted) electrons. The dark-field images are obtained by detecting the electrons that scatter as they pass through the sample.

FIGS. 1A and 1B show steps in thinning and imaging a TEM sample according to the prior art. The sample 6 is typically attached to a TEM sample holder 24 and thinned using a focused ion beam 22 (FIB). The sample can be imaged with an electron beam 25 in a TEM or STEM as shown in FIG. 1B. A typical dual beam FIB/SEM has the SEM column oriented normal to the sample (at 90 degrees) and the FIB column at an angle of approximately 52 degrees. It is often desirable to image the sample during milling using the SEM. Imaging using SEM or S/TEM during sample thinning allows the sample thickness and location of the feature of interest within the sample to be monitored directly. S/TEM imaging can be used even when the sample surface is at an angle to the electron beam (as would be the case when the sample is oriented toward the ion beam during milling) by compensating for the angle mathematically.

Because a sample must be very thin for viewing with transmission electron microscopy (whether TEM or STEM), preparation of the sample can be delicate, time-consuming work. Accurately determining the endpoint for lamella creation is becoming even more difficult as devices grow in complexity and shrink in size. Smaller features can require smaller and thinner S/TEM samples. In many cases, samples are thinned using a focused ion beam system. It is often very difficult to determine when the sample has been sufficiently thinned. If samples are left too thick they won't be sufficiently transparent to the electrons for S/TEM analysis. On the other hand, if the sample is thinned too much, the features to be measured or even the entire sample may be destroyed. Even for a sample that is within the acceptable range of thickness, variation between samples is undesirable.

Consequently, precise endpoint detection for lamella thinning is very important. Historically, the TEM sample preparation process has been performed using instruments operated manually. Attempting to determine the precise endpoint for sample thinning (i.e., endpointing) is typically more of a guess than an actual calculated endpoint determination. For this reason, successful S/TEM sample preparation generally requires the use of highly trained and experienced operators and technicians. Even then, it is very difficult to meet any reasonable standards of reproducibility and throughput. Even though the information that can be discovered by TEM analysis can be very valuable, the entire process of creating and measuring TEM samples has historically been so labor intensive and time consuming that it has not been practical to use this type of analysis for manufacturing process control.

What is needed is a method of precisely calculating an endpoint for FIB sample thinning to use in TEM sample creation. What is also needed is a method that lends itself to automation to increase throughput and reproducibility so that TEM measurement can be incorporated into integrated or in situ metrology for process control.

BRIEF SUMMARY OF THE INVENTION

An object of the invention, therefore, is to provide an improved method for TEM sample creation. Preferred embodiments of the present invention provide improved methods for endpointing sample thinning and methods to partially or fully automate endpointing to increase throughput and reproducibility of TEM sample creation.

To this end, the invention provides a method of determining the thickness of a sample, in particular a TEM sample, comprising the steps of obtaining a diffraction pattern image of a sample of a first material, said diffraction pattern image comprising at least image values representative for the diffraction pattern obtained for said sample; determining a slope of said image values in said diffraction pattern image; providing, for said first material, a relation between the thickness of said first material and the slope of image value of a corresponding diffraction pattern image of said first material; and using the determined slope and said relation for determining the thickness of said sample.

According to the invention, use is made of the way the signal in image value drops with spatial frequency as a measure for the sample thickness. This allows the quality of a prepared lamella to be monitored in situ in a FIB/SEM system by evaluation of diffraction patterns, and comparing these to reference diffraction patterns obtained for said first material. In particular, it was found that the slope of the image values, i.e. the value gradient in the diffraction pattern image, is related to the thickness of the sample. Hence, a relationship can be provided between the thickness of the first material and the slope of image value, i.e. the value gradient from light to dark that is present in the image. This relation may be provided as a standardized relation, but it is conceivable as well that this relation is established by the user just before the sample is being thinned. This relation provided may then be used to determine the thickness of the sample being thinned, by comparing the value slope in the obtained diffraction pattern image to the relationship provided. The diffraction pattern image may be acquired using a charged particle beam, such as a scanning electron beam, whilst the lamella is being thinned using the focused ion beam. If needed, the lamella can be tilted during this process to facilitate usage during the thinning and the cleaning process. Additionally, the optical modes of the SEM do not have to be switched, and therefore standard SEM techniques can be used for visual end-pointing. With this, the object of the invention is achieved.

It should be noted that in principle the method as described above works on any material as a first material, such as, for example, monocrystalline, polycrystals, nanocrystals or amorphous structures.

It is noted that electron diffraction is routinely used on TEM and STEM systems including in-situ monitoring of specimen evaluation. However usage in FIB/SEM systems is limited to conventional EBSD or transmission Kikuchi configuration. These approaches dot not allow reasonable results similar to (S)TEM on thin samples (5-200 nm) which are routinely prepared by DualBeam systems. To overcome these drawbacks, the diffraction pattern may be monitored in an embodiment by a detector that is placed below the sample. This geometry allows simultaneous in-situ quantitative monitoring of both sample thickness and sample quality during the sample preparation process. Potential issues, such as re-deposition and contamination of the sample, may be detected in various operating conditions ranging from room temperature to cryo operations as well.

Thus, in an embodiment, image value may be related to the detector signal, and in particular to electron counting.

The detector may in an embodiment be a pixelated camera based on the Medipix and/or Timepix detector family. The Medipix and Timepix is a family of photon counting and particle tracking pixel detectors developed by an international collaboration hosted by CERN, and this detector family is well known to those skilled in the art.

In an embodiment, the method comprises the step of determining the diffraction pattern center of said diffraction pattern image. The diffraction pattern center is normally the most brightest part of the diffraction pattern image. Determining the diffraction pattern center is relatively easy, and allows for accurate determination of the value slope.

The slope may be determined radially outwards from the diffraction pattern center. The determination may comprise normalizing the image values in at each radial position.

In an embodiment, the following equation may be used to describe the relationship between the image values as a function of the position in the image:

$$f(x,y) = k \cdot \sqrt[1]{(x-x_0)^2 + (y-y_0)^2} + c$$

In which:
f=the image values representative for the diffraction pattern;
x,y=coordinates of the diffraction pattern image;
$x_0$, $y_0$=the diffraction pattern center;
k=the slope; and
c=a constant.

It is noted that the image values f may in an embodiment be related to the electron count EC as f=log(log(EC)). This provides a linear relationship for image values as a function of radial position.

The obtained diffraction pattern image of said sample is fitted to said function, with k and c as variables. Thus, fitting the image values of the diffraction pattern image to the function leads to a value for k, and a value for c.

Providing a relation between the thickness of said first material and the slope of image value of a corresponding diffraction pattern image of said first material, may comprise providing the equation:

$$k(z) = a \cdot z^{-b}$$

In which:
k=the slope;

z=the thickness;

a, b=constants.

The constants a and b are specific for said first material, and may be obtained in a calibration step. In an embodiment, this may be done by providing a plurality of samples of a first material having mutually different thicknesses, obtaining respective diffraction patterns, and establishing said relation between the thickness of said first material and the slope of image value of a corresponding diffraction pattern image of said first material. With the slope k and the thickness z known, for various thicknesses, it is possible to determine constants a and b for said first material.

In an embodiment, the step of providing a plurality of samples of a first material having mutually different thicknesses comprises the step of providing a tapered specimen. With a tapered specimen it is relatively easy to do the above mentioned calibration step, as the different thicknesses z are located in a single sample.

It is noted that in the above method, removal (i.e. masking) of diffraction spots of crystalline material may be used, to increase the accuracy of the slope determination.

According to an aspect, a method of monitoring the thickness of a sample during thinning using a focused ion beam is provided. The method comprises the steps of providing a sample to be thinned, and determining the thickness of said sample using the method as described above. In an embodiment, the method may comprise the step of establishing an end-point of thinning of said sample, based on the determined thickness. Advantages of the method have already been explained above.

According to an aspect, a dual beam charged particle microscope is provided, comprising:

A sample holder, for holding a sample;

An ion beam column, for producing an ion beam onto said sample for thinning said sample;

An electron beam column, for producing an electron beam onto said sample;

A detector, for detecting radiation emanating from said sample and arranged for obtaining a diffraction pattern of said sample; and A controller, for at least partially controlling operation of said microscope.

With such a dual beam charged particle microscope, the method as explained herein can be executed.

In particular, the controller may be arranged for determining and/or monitoring the thickness of said sample, using a method as described herein.

BRIEF DESCRIPTION OF THE DRAWINGS

For a more thorough understanding of the present invention, and advantages thereof, reference is now made to the following descriptions taken in conjunction with the accompanying drawings, in which:

FIG. 3 shows a wedge shaped sample of a silicon material, that was used to establish a relationship between sample thickness and diffraction pattern image.

FIG. 4A shows a diffraction pattern image obtained for the sample shown in FIG. 3, at position 1.

FIG. 4B shows a diffraction pattern image obtained for the sample shown in FIG. 3, at position 6.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF THE INVENTION

Figure 1A:
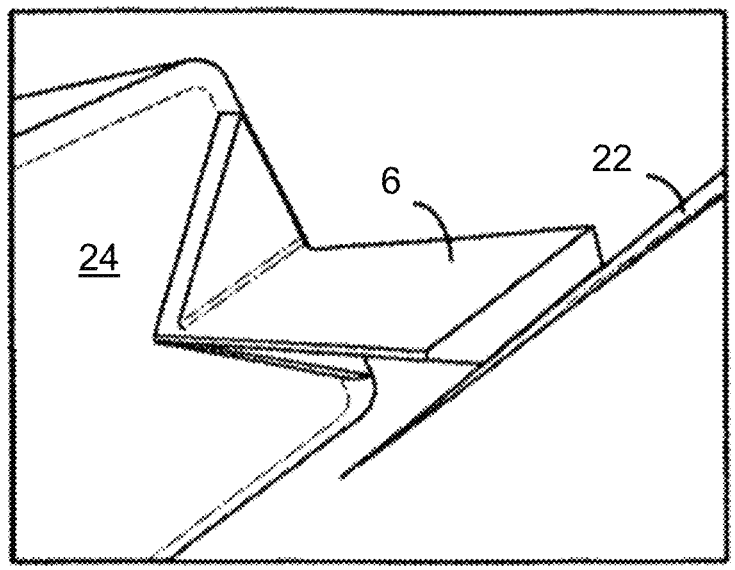
FIG. 1A shows sample thinning using a focused ion beam according to the prior art.
Figure 1B:
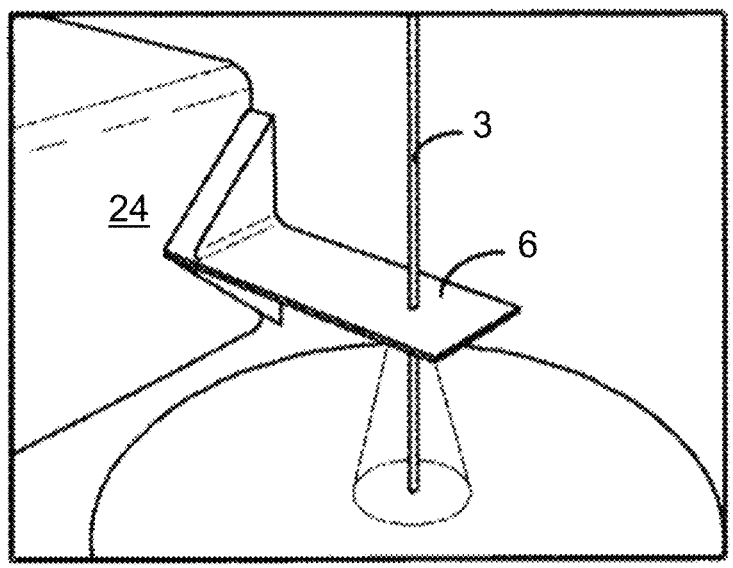
FIG. 1B shows imaging of the thinned sample of FIG. 1A using a S/TEM according to the prior art.

As already described above, FIGS. 1A and 1B show steps in thinning and imaging a TEM sample according to the prior art. The sample 6 is typically attached to a TEM sample holder 24 and thinned using a focused ion beam 22 (FIB). The sample can be imaged with an electron beam 25 in a TEM or STEM as shown in FIG. 1B. A typical dual beam FIB/SEM has the SEM column oriented normal to the sample (at 90 degrees) and the FIB column at an angle of approximately 52 degrees.

Figure 2:
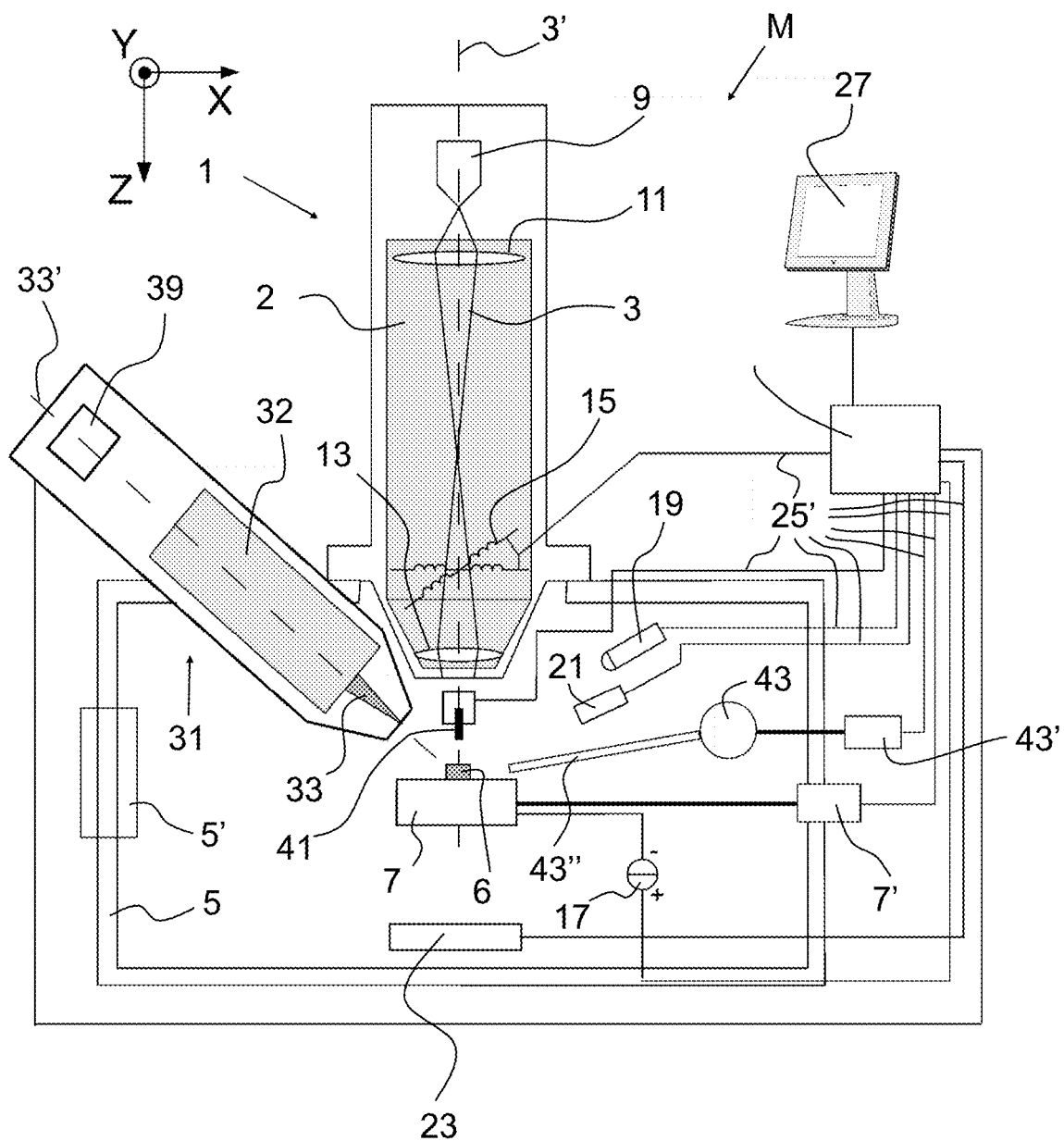
FIG. 2 shows a longitudinal cross-sectional elevation view of an embodiment of a dual-beam charged particle microscope.

FIG. 2 shows a highly schematic depiction of an embodiment of a dual-beam charged particle microscope (CPM), with which the thickness of a sample may be determined. More specifically, FIG. 2 shows an embodiment of a FIB-SEM. The microscope M comprises a particle-optical column 1, which produces a beam 3 of charged particles (in this case, an electron beam) that propagates along a particle-optical axis 3'. The column 1 is mounted on a vacuum chamber 5, which comprises a sample holder 7 and associated actuator(s) 7' for holding/positioning a sample 6. The vacuum chamber 5 is evacuated using vacuum pumps (not depicted). With the aid of voltage supply 17 the sample holder 7, or at least the sample 6, may, if desired, be biased (floated) to an electrical potential with respect to ground. Also depicted is a vacuum port 5', which may be opened so as to introduce/remove items (components, samples) to/from the interior of vacuum chamber 5. A microscope M may comprise a plurality of such ports 5', if desired.

The column 1 (in the present case) comprises an electron source 9 (such as a Schottky gun, for example) and an illuminator 2. This illuminator 2 comprises (inter alia) lenses 11, 13 to focus the electron beam 3 onto the sample 6, and a deflection unit 15 (to perform beam steering/scanning of the beam 3). The microscope M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of "stimulated" radiation emanating from the sample 6 in response to irradiation by the (impinging) beam 3. In the apparatus depicted here, the following (non-limiting) detector choices have been made:

Detector 19 is a solid state detector (such as a photodiode) that is used to detect cathodoluminescence emanating from the sample 6. It could alternatively be an X-ray detector, such as Silicon Drift Detector (SDD) or Silicon Lithium (Si(Li)) detector, for example;

Detector 21 is an electron detector in the form of a Solid State Photomultiplier (SSPM) or evacuated Photomultiplier Tube (PMT) [e.g. Everhart-Thornley detector], for example. This can be used to detect backscattered and/or secondary electrons emanating from the sample 6.

Detector 23 is a pixelated direct electron detector that is positioned below the sample 6 and sample holder 7, and arranged for determining the diffraction pattern of the sample 6. Based on electron counting, a diffraction image can be obtained for the sample, and this diffraction image may be used to determine the thickness of the sample 6, as will be explained later.

The skilled artisan will understand that many different types of detector can be chosen in a set-up such as that depicted, including, for example, an annular/segmented detector.

As is known to those skilled in the art, by scanning the beam 3 over the sample 6, stimulated radiation—comprising, for example, X-rays, infrared/visible/ultraviolet light, secondary electrons (SEs) and/or backscattered electrons (BSEs)—emanates from the sample 6. Since such stimulated radiation is position-sensitive (due to said scanning motion), the information obtained from the detectors 19, 21 will also be position-dependent. This fact allows (for instance) the signal from detector 21 to be used to produce a BSE image of (part of) the sample 6, which image is basically a map of said signal as a function of scan-path position on the sample 6.

The signals from the detectors 19, 21, 23 pass along control lines (buses) 25'; are processed by the controller 25; and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

In addition to the electron column 1 described above, the microscope M also comprises an ion-optical column 31. This comprises an ion source 39 and an illuminator 32, and these produce/direct an ion beam 33 along an ion-optical axis 33'. To facilitate easy access to sample 6 on holder 7, the ion axis 33' is canted relative to the electron axis 3'. As hereabove described, such an ion (FIB) column 31 can, for example, be used to perform processing/machining operations on the sample 6, such as thinning, but also incising, milling, etching, depositing, etc. Alternatively, the ion column 31 can be used to produce imagery of the sample 6. It should be noted that ion column 31 may be capable of generating various different species of ion at will, e.g. if ion source 39 is embodied as a so-called NAIS source; accordingly, references to ion beam 33 should not necessarily been seen as specifying a particular species in that beam at any given time—in other words, the beam 33 might comprise ion species A for operation A (such as milling) and ion species B for operation B (such as implanting), where species A and B can be selected from a variety of possible options.

Also illustrated is a Gas Injection System (GIS) 43, which can be used to effect localized injection of gases, such as etching or precursor gases, etc., for the purposes of performing gas-assisted etching or deposition. Such gases can be stored/buffered in a reservoir 43', and can be administered through a narrow nozzle 43", so as to emerge in the vicinity of the intersection of axes 3' and 33', for example.

A manipulator device (nanomanipulator) 41 may be present as well, which can be used to assist in transferring items (e.g. samples, or parts thereof) to/from the sample holder 7.

It should be noted that many refinements and alternatives of such a set-up will be known to the skilled artisan, such as the use of a controlled environment within (a relatively large volume of) the microscope M, e.g. maintaining a background pressure of several mbar (as used in an Environmental SEM or low-pressure SEM).

Summarized, FIG. 2 shows a dual beam charged particle microscope M comprising:

A sample holder 7, for holding a sample 6;

An ion beam column 31, for producing an ion beam 33 onto said sample 6 for thinning said sample;

An electron beam column 1, for producing an electron beam 3 onto said sample 6;

A detector 23, for detecting radiation emanating from said sample and arranged for obtaining a diffraction pattern of said sample 6; and A controller 25, for at least partially controlling operation of said microscope.

With the charged particle microscope M as described above, it is possible to perform an improved method for lamella creation. By obtaining a diffraction pattern image of the sample 6 in the dual-beam FIB/SEM, using detector 23 for example, a sample may be thinned using the FIB, while the diffraction pattern image is used to monitor sample thickness. Preferably, the electron beam and the ion beam can be operated at the same time (or intermittently) so thickness measurement is available during the thinning process. In an embodiment, the controller 25 of the charged particle microscope M is arranged for determining and/or monitoring the thickness of said sample 6, for example using a method as described herein.

FIG. 3 shows a wedge shaped sample 106 of a silicon material, that was used to establish a relationship between sample thickness and diffraction pattern image. A total of 6 positions were investigated, and sample thickness ranged from approximately 14 nm to 75 nm. For each position, the diffraction pattern image was recorded, and the resulting image was analyzed to establish a relationship between the thickness of the first material and the slope of image value of the corresponding diffraction pattern image of said first material.

FIGS. 4a and 4b show respective diffraction pattern images obtained for the sample shown in FIG. 3, at positions 1 and 6, having thicknesses of approximately 14 nm and 75 nm, respectively. For each of these pictures, the diffraction pattern center of the diffraction pattern image is determined, and assigned as having coordinates $x_0$ and $y_0$.

Figure 5A:
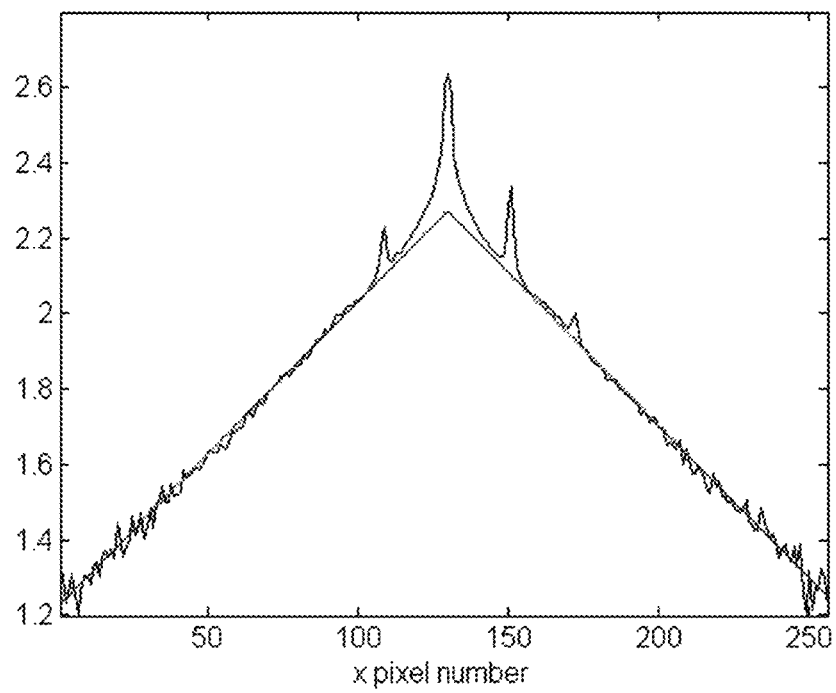
FIG. 5A shows a corresponding log(log(EC)) graph of the diffraction pattern image shown in FIG. 4A, as a function of the x coordinate in the image.
Figure 5B:
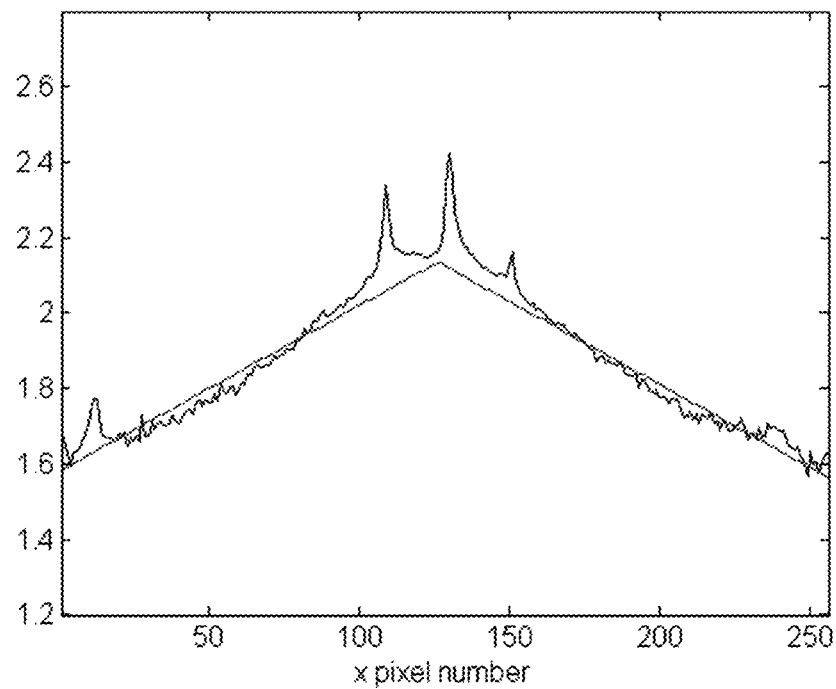
FIG. 5B shows a corresponding log(log(EC)) graph of the diffraction pattern image shown in FIG. 4B, as a function of the x coordinate in the image.

For each image, the actual electron counts (EC) are used to represent the diffraction pattern image. FIGS. 5a and 5b show corresponding log(log(EC)) graphs of the diffraction pattern images shown in FIGS. 4a and 4b, as a function of the x coordinate in the image (with the y coordinate being fixed at position $y_0$, i.e. running through the center of the diffraction pattern image). The diffraction pattern center (peak in the image) is clearly visible. Also indicated in FIGS. 5a and 5b is a linear fit (black line), based on the following equation:

$$f(x,y) = -k \cdot \sqrt{(x-x_0)^2 + (y-y_0)^2} + c$$

In which:

f=the image values representative for the diffraction pattern;

x,y=coordinates of the diffraction pattern image;

$x_0$, $y_0$=the diffraction pattern center;

k=the slope; and c=a constant.

As mentioned before, here the log(log(EC)) is used as image values representative for the diffraction pattern. It will be understood that other ways of using the image values, and determining a slope, are conceivable as well.

With the above equation, it was found that k=0.008095 and c=2.273 for FIG. 3a; and these values were k=0.004406 and c=2.135 for FIG. 3b. So this means that the slope k is steeper when the sample is thinnest.

The relation between the thickness z of said first material and the slope k of the image value of a corresponding diffraction pattern can be represented with the following equation:

$$k(z) = a \cdot z^{-b}$$

In which:
k=the slope;
z=the thickness;
a, b=constants.

It will be understood that other functions may be used as well, although this equation was found to provide satisfactory results.

Figure 6:
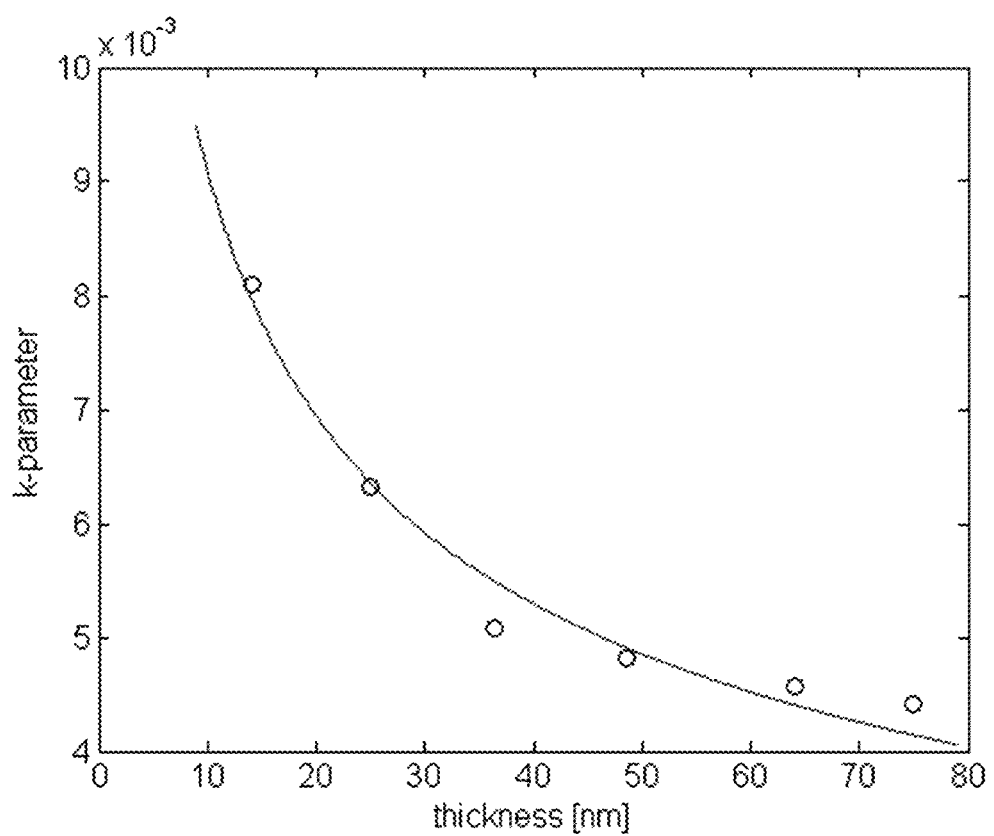
FIG. 6 shows the relation between the thickness of the sample and the determined k-parameters.

FIG. 6 shows the relation between the thickness of the sample (wedge shaped sample as shown in FIG. 3) and the determined k-parameter (circles), and including the fitted function, where a=0.02237 and b=0.3906.

Thus, from the above it followed that a plurality of samples of a first material having mutually different thicknesses may be provided, respective diffraction patterns may be obtained, and a relation between the thickness of said first material and the slope of image value of a corresponding diffraction pattern image of said first material may be established. In particular, in the example shown, the step of providing a plurality of samples of a first material having mutually different thicknesses comprises the step of providing a tapered specimen. This way, the relationship between the thickness and the slope is provided by means of a specific calibration step for a given material.

It is, however, not strictly necessary to do this kind of calibration. As an alternative, which is less precise, the relation between the thickness of the sample and the slope of image value may be provided by means of a calculation and/or simulation for a given type of material.

In any event, the method as described above can be used for monitoring the thickness of a sample during thinning thereof using a focused ion beam, and comprises the steps of providing a sample to be thinned; and determining the thickness of said sample. In particular, with the determined thickness it is possible to establishing an end-point of thinning of said sample, based on the determined thickness.

Although the description above is mainly directed at a method for determining the thickness of a sample, in particular for endpointing sample thinning and creation, it should be recognized that an apparatus performing the operation of this method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention have broad applicability and can provide many benefits as described and shown in the examples above. The embodiments will vary greatly depending upon the specific application, and not every embodiment will provide all of the benefits and meet all of the objectives that are achievable by the invention. For example, in a preferred embodiment S/TEM lamella samples are created using a gallium liquid metal ion source to produce a beam of gallium ions focused to a sub-micrometer spot. Such focused ion beam systems are commercially available, for example, from FEI Company, the assignee of the present application. However, even though much of the previous description is directed toward the use of FIB milling, the milling beam used to process the desired S/TEM samples could comprise, for example, an electron beam, a laser beam, or a focused or shaped ion beam, for example, from a liquid metal ion source or a plasma ion source, or any other charged particle beam.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

Although much of the previous description is directed at semiconductor wafers, the invention could be applied to any suitable substrate or surface. Also, the present invention is not necessarily limited to S/TEM samples, but could be used for any sample where it is desirable for a sample to be thinned to electron transparency and to have the endpoint determination precisely controlled.

Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams. To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of determining the thickness of a sample, comprising the steps of:
   obtaining a diffraction pattern image of a sample of a first material, wherein the diffraction pattern image comprises at least image values representative for the diffraction pattern obtained for the sample;
   determining a diffraction pattern center of the diffraction pattern image;
   determining a slope of the image values;
   providing, for the first material, a relation between the thickness of the first material and the slope of image values of a corresponding diffraction pattern image of the first material; and
   using the determined slope and the relation to determine the thickness of the sample.

2. A method according to claim 1, wherein obtaining the diffraction pattern image comprises obtaining the diffraction pattern image with a charged particle beam.

3. A method according to claim 2, wherein obtaining the diffraction pattern image with the charged particle beam comprises obtaining the diffraction pattern image with an electron beam.

4. A method according to claim 1, wherein determining the slope of the image values comprises determining the slope of the image values radially outwards from the diffraction pattern center.

5. A method according to claim 1, wherein determining the slope comprises determining the slope of the image values basted at least in part on use of a function:

$$f(x,y) = k \cdot \sqrt{(x-x_0)^2 + (y-y_0)^2} + c$$

wherein:
   f=the image values representative for the diffraction pattern;
   x,y=coordinates of the diffraction pattern image;
   $x_0$, $y_0$=the diffraction pattern center;
   k=the slope; and
   c=a constant.

6. A method according to claim 5, wherein determining the slope of the image values comprises determining the slope of an Electron Count (EC), wherein the EC is used as image values representative for the diffraction pattern, such as in form of f(x,y)=log(log(EC(x,y))).

7. A method according to claim 5, wherein determining the slope of the image values comprises fitting the diffraction pattern image of the sample to the function, with k and c as variables.

8. A method according to claim 1, further comprising the step of determining the relation between the thickness of the first material and the slope of image value of a corresponding diffraction pattern image of the first material, based at least in part on the function:

$$k(z) = a \cdot z^{-b}$$

wherein:
   k=the slope;
   z=the thickness; and
   a, b=constants.

9. A method according to claim 1, comprising the steps of:
   providing a plurality of samples of a first material having mutually different thicknesses;
   obtaining respective diffraction patterns; and
   establishing the relation between the thickness of the first material and the slope of image value of a corresponding diffraction pattern image of the first material.

10. A method according to claim 9, wherein the step of providing a plurality of samples of a first material having mutually different thicknesses comprises the step of providing a tapered specimen.

11. A method according to claim 1, further comprising monitoring the thickness of the sample during thinning of the sample.

12. A method according to claim 11, further comprising the step of establishing an end-point of thinning of the sample, based on the determined thickness.

13. A dual beam charged particle microscope comprising:
   a sample holder, for holding a sample;
   an ion beam column, for producing an ion beam onto the sample for thinning the sample;
   an electron beam column, for producing an electron beam onto the sample;
   a detector, for detecting radiation emanating from the sample and arranged for obtaining a diffraction pattern of the sample;
   a controller, for at least partially controlling operation of the microscope to cause the microscope to:

obtain a diffraction pattern image of a sample of a first material, wherein the diffraction pattern image comprises at least image values representative for the diffraction pattern obtained for the sample;

determine a diffraction pattern center of the diffraction pattern image;

determine a slope of the image values;

provide, for the first material, a relation between the thickness of the first material and the slope of image value of a corresponding diffraction pattern image of the first material; and use the determined slope and the relation to determine the thickness of the sample.

14. A dual beam charged particle microscope of claim 13, wherein the controller is configured to further cause the microscope to determine a diffraction pattern center of the diffraction pattern image.

15. A dual beam charged particle microscope of claim 14, wherein the controller is configured to further cause the microscope to determine the slope of the image values radially outwards from the diffraction pattern center.

16. A dual beam charged particle microscope of claim 13, wherein the controller is configured to further cause the microscope to use the determined slope and the relation to monitor the thickness of the sample during thinning of the sample.

17. A dual beam charged particle microscope of claim 16, wherein the controller is configured to further cause the microscope to establish an end-point of thinning of the sample, based on the determined thickness.

18. A dual beam charged particle microscope of claim 13, wherein the controller is configured to further cause the microscope to:

receive an additional sample of the first material; and use the determined slope and the relation to monitor the thickness of the additional sample during thinning of the additional sample.

* * * * *